United States Patent
Bae et al.

(10) Patent No.: US 7,518,898 B2
(45) Date of Patent: Apr. 14, 2009

(54) SEMICONDUCTOR MEMORY DEVICE WITH STRENGTHENED POWER AND METHOD OF STRENGTHENING POWER OF THE SAME

(75) Inventors: Chang-Hyun Bae, Daegu Metropolitan City (KR); Nak-won Heo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 273 days.

(21) Appl. No.: 11/316,829

(22) Filed: Dec. 22, 2005

(65) Prior Publication Data

US 2006/0181913 A1 Aug. 17, 2006

(30) Foreign Application Priority Data

Jan. 10, 2005 (KR) .................. 10-2005-0002050

(51) Int. Cl.
*G11C 5/06* (2006.01)
(52) U.S. Cl. .................. 365/72; 365/63; 365/51; 365/227; 365/228; 365/189.03; 365/189.05
(58) Field of Classification Search ............ 365/51, 365/63, 72, 227, 226, 189.05, 228, 189.03
See application file for complete search history.

(56) References Cited

U.S. PATENT DOCUMENTS

| | | | | |
|---|---|---|---|---|
| 5,838,627 A | * | 11/1998 | Tomishima et al. | 365/230.03 |
| 5,847,449 A | * | 12/1998 | Takata et al. | 257/691 |
| 5,869,870 A | | 2/1999 | Lin | 257/355 |
| 5,895,887 A | * | 4/1999 | Takata et al. | 174/541 |
| 6,577,157 B1 | * | 6/2003 | Cheung et al. | 326/38 |

FOREIGN PATENT DOCUMENTS

| | | |
|---|---|---|
| KR | 10-2000-0027792 | 5/2000 |
| KR | 10-2001-0059288 | 7/2001 |

* cited by examiner

*Primary Examiner*—Andrew Q Tran
(74) *Attorney, Agent, or Firm*—Mills & Onello, LLP

(57) ABSTRACT

In a semiconductor memory device the power level of which is strengthened by using data input/output pads in a no connection state, and a method of strengthening the power of the semiconductor memory device at a stabilized power level, the semiconductor memory device comprises: a plurality of data input/output drivers; and a plurality of data input/output pads, each connected to a corresponding one of the plurality of data input/output drivers. A first subset of the data input/output pads are connected to respective data input/output pins of a package, and several or all of a remaining subset of the data input/output pads that are not connected to data input/output pins of the package are connected to power pins of the package.

14 Claims, 5 Drawing Sheets

SEMICONDUCTOR MEMORY DEVICE WITH STRENGTHENED POWER AND METHOD OF STRENGTHENING POWER OF THE SAME

CROSS-REFERENCE TO RELATED PATENT APPLICATIONS

This application claims the priority of Korean Patent Application No. 10-2005-0002050, filed on Jan. 10, 2005, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a semiconductor memory device with strengthened power and a method of strengthening the power of a semiconductor memory device.

2. Description of the Related Art

Semiconductor memory devices are commonly arranged according to several data bit configurations, referred to as "organizations". For instance, semiconductor memory devices can be arranged according to X4, X8, and X16 data bit organizations. In the X4 data bit organization, the data bandwidth, i.e., the number of bits of data, which is to be simultaneously input to and output from the semiconductor memory device, is 4 bits. In the X8 data bit organization, the data bandwidth is 8 bits, and in the X16 data bit organization, the data bandwidth is 16 bits.

Accordingly, the number of data input/output (I/O) pads, and the bonding arrangements among the data I/O pads and pins of a semiconductor memory package vary according to the type of organization. Semiconductor memory devices can include various organizations within a chip, but the package is designed according to an organization in which data bandwidth can be maximized.

FIG. 1 is a view of a bonding configuration for an X4 organization of a conventional semiconductor memory device. Referring to FIG. 1, data I/O pads PAD_LDQ0 through PAD_LDQ3 used in the X4 organization are bonded to corresponding data I/O pins LDQ0 through LDQ3 of a package. The other data I/O pads PAD_LDQ4 through PAD_LDQ7 and PAD_UDQ0 through PAD_UDQ7, which are not used in the X4 organization but are used in the X8 and X16 organizations, are not connected to their corresponding data I/O pins. That is, the data I/O pads PAD_LDQ4 through PAD_LDQ7 and PAD_UDQ0 through PAD_UDQ7 are in a no connection (NC) state.

FIG. 2 is a view of a bonding configuration for the X8 organization of a conventional semiconductor memory device. Referring to FIG. 2, in the X8 organization, data I/O pads PAD_LDQ0 through PAD_LDQ7 are bonded to corresponding data I/O pins LDQ0 through LDQ7 of a package. The other data I/O pads PAD_UDQ0 through PAD_UDQ7 are not connected to data I/O pins, that is, they are in the NC state.

FIG. 3 is a block diagram of a data I/O driver 300 connected to data I/O pads of a conventional semiconductor memory device, which are in the NC state. The data I/O driver 300 includes an output buffer 31 whose output terminal is connected to a corresponding pad PAD_UDQ; an input buffer 32 whose input terminal is connected to the pad PAD_UDQ; and an NMOS transistor 33 for the purpose of electrostatic discharge (ESD) protection, which is connected between the pad PAD_UDQ and a ground voltage line VSS.

However, since some of data I/O pads of a conventional semiconductor memory device are in the NC state, the use efficiency of the data I/O pads is low. In general, the greater the bandwidth of a memory device, i.e., the bit value of data to be simultaneously input to and output from the semiconductor memory device, the more that power noise, such as ground bounce, can have an effect on system operation. Also, in general, the lower a power supply voltage, the greater the level of power noise.

SUMMARY OF THE INVENTION

The present invention provides a semiconductor memory device whose power is strengthened by using data input/output (I/O) pads in a no connection state. The strengthened power reduces the effect of power noise on a semiconductor memory device.

The present invention also provides a method of strengthening the power of such a semiconductor memory device.

In one aspect, the present invention is directed to a semiconductor memory device having a plurality of data bit organization arrangements, comprising: a plurality of data input/output drivers; and a plurality of data input/output pads, each connected to a corresponding one of the plurality of data input/output drivers. A first subset of the data input/output pads are connected to respective data input/output pins of a package, and several or all of a remaining subset of the data input/output pads that are not connected to data input/output pins of the package are connected to power pins of the package.

In one embodiment, each power pin comprises one of a power supply voltage pin and a ground voltage pin.

In another embodiment, each of the data input/output drivers that is connected to one of the second subset of data input/output pads which are not connected to the data input/output pins of the package comprises: an output pad, an output terminal of which is connected to a corresponding data input/output pad; an input buffer, an input terminal of which is connected to the corresponding data input/output pad; a first NMOS transistor, a drain and source of which are connected to the corresponding data input/output pad and a ground voltage line, respectively; and a second NMOS transistor, a drain and source of which are connected to a gate and the source of the first NMOS transistor, respectively, wherein when an information signal representing a predetermined one of the plurality of data bit organization arrangements is activated, the second NMOS transistor is turned on, and when information signals representing the other organizations are activated, the first NMOS transistor is turned on.

In another embodiment, each of the data input/output drivers that is connected to one of the second subset of data input/output pads which are not connected to the data input/output pins of the package comprises: an output buffer, an output terminal of which is connected to a corresponding data input/output pad; an input buffer, an input terminal of which is connected to the corresponding data input/output pad; a first PMOS transistor, a drain and source of which are connected to the corresponding data input/output pad and a power supply voltage line, respectively; and a second PMOS transistor, a drain and source of which are connected to a gate and the source of the first PMOS transistor, respectively, wherein when an information signal representing a predetermined one of the plurality of data bit organization arrangements is activated, the second PMOS transistor is turned on, and when information signals representing the other organizations are activated, the first PMOS transistor is turned on.

In another embodiment, the data bit organization arrangements comprise X4, X8, and X16 organizations.

In another aspect, the present invention is directed to a method of strengthening power of a semiconductor memory device at a stabilized power level, the semiconductor memory device having a plurality of data bit organization arrangements, the method comprising connecting several or all of data input/output pads that are not connected to data input/output pins of a package, to power pins of the package.

In one embodiment, each power pin comprises one of a power supply voltage pin and a ground voltage pin.

In another embodiment, the method further comprises: providing a first NMOS transistor between a data input/output pad connected to the ground voltage pin and a ground voltage line of the device; providing a second NMOS transistor between a gate of the first NMOS transistor and the ground voltage line; activating the second NMOS transistor when an information signal representing a predetermined one of the plurality of organizations is activated; and activating the first NMOS transistor when information signals representing the other organizations are activated.

In another embodiment, the method further comprises: providing a first PMOS transistor between a data input/output pad connected to the power supply voltage pin and a power supply voltage line of the device; providing a second PMOS transistor between a gate of the first PMOS transistor and the power supply voltage line; activating the second PMOS transistor when an information signal representing a predetermined one of the plurality of organizations is activated; and activating the first PMOS transistor when information signals representing the other organizations are activated.

In another embodiment, the data bit organization arrangements comprise X4, X8, and X16 organizations.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
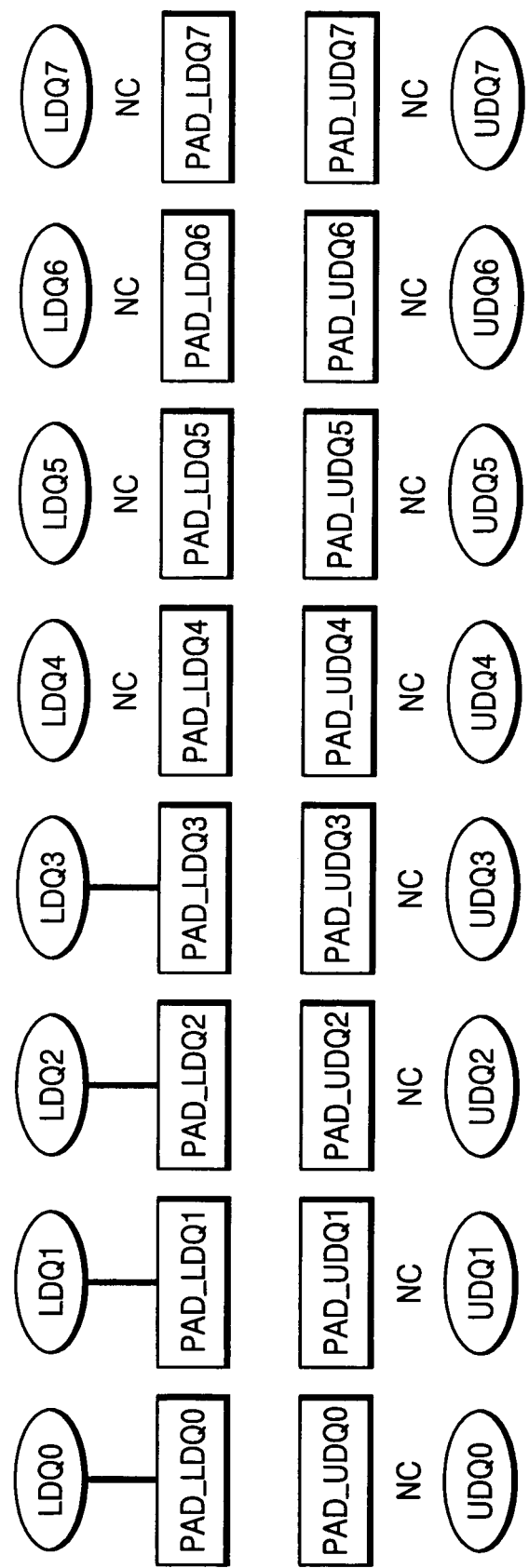
FIG. 1 is a view of a bonding configuration for an X4 organization of a conventional semiconductor memory device.
Figure 2:
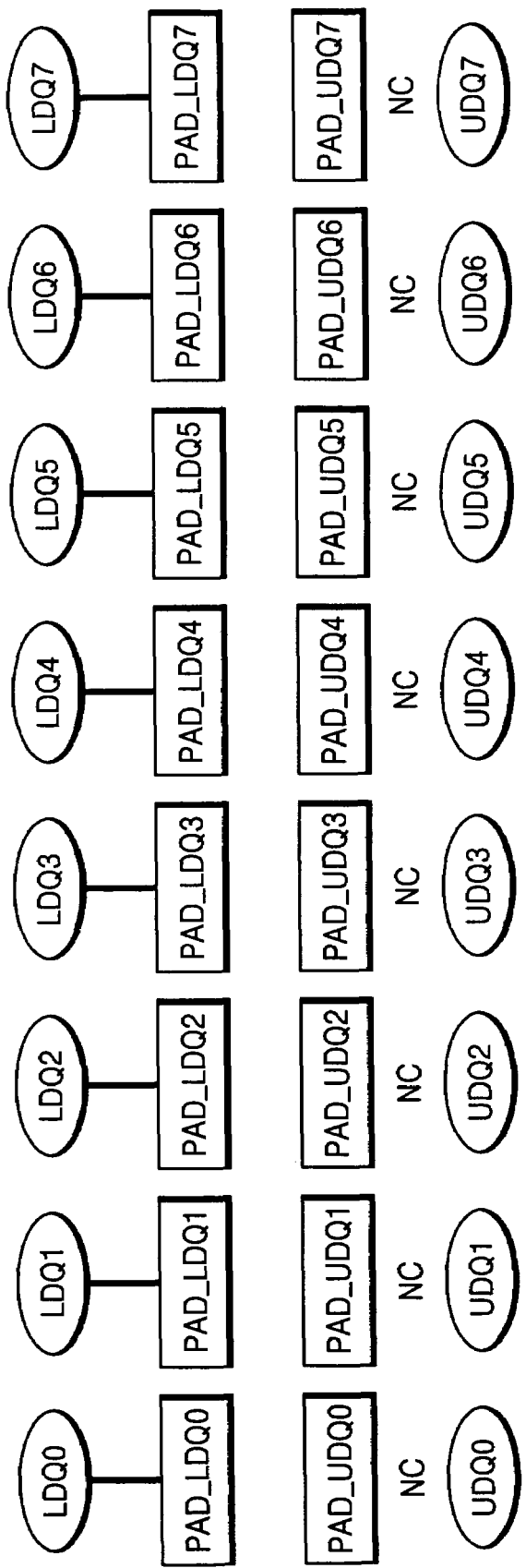
FIG. 2 is a view of a bonding configuration for an X8 organization of a conventional semiconductor memory device.
Figure 3:
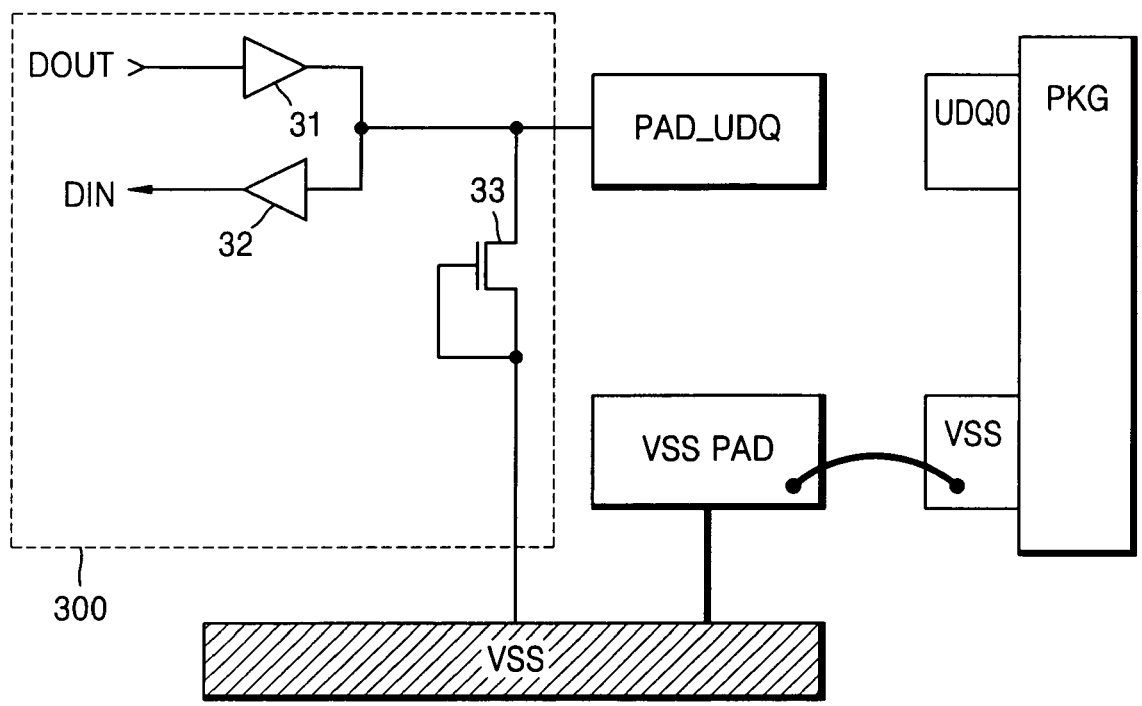
FIG. 3 is a block diagram of a data input/output (I/O) driver connected to pads of a conventional memory device, the pads being in the no connection state.

Hereinafter, exemplary embodiments of the present invention will be described in detail with reference the accompanying drawings. Like reference numerals are used to designate like or equivalent elements throughout this disclosure.

Figure 4:
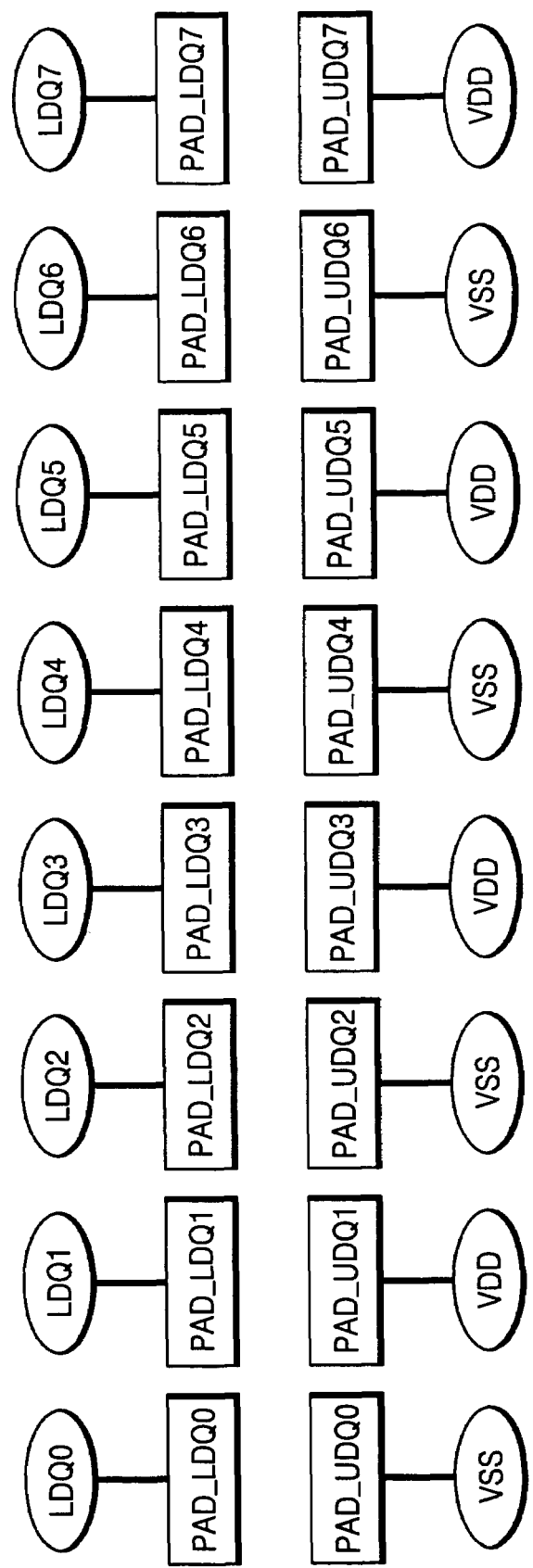
FIG. 4 is a view of a bonding configuration for an X8 organization of a semiconductor memory device according to an embodiment of the present invention.

FIG. 4 is a view of a bonding configuration for an X8 organization arrangement of a semiconductor memory device according to an embodiment of the present invention. Referring to FIG. 4, data input/output (I/O) pads PAD_LDQ0 through PAD_LDQ7 used in the X8 organization are bonded, or connected, to corresponding data I/O pins LDQ0 through LDQ7 of a package. In addition, for effective use of pads, the other data I/O pads PAD_UDQ0 through PAD_UDQ7, which are used in the X16 organization arrangement and not used in the X8 organization arrangement, are bonded to power pins VSS and VDD of the package.

Here, VSS denotes a ground voltage pin and VDD denotes a power supply pin.

Each data I/O driver (not shown) connected to the data I/O pads PAD_UDQ0 through PAD_UDQ7 includes a switch transistor which operates in response to an information signal representing an organization arrangement of the semiconductor memory device. The switch transistor allows the data I/O pads PAD_UDQ0 through PAD_UDQ7 to be selectively used as power pads.

Figure 5:
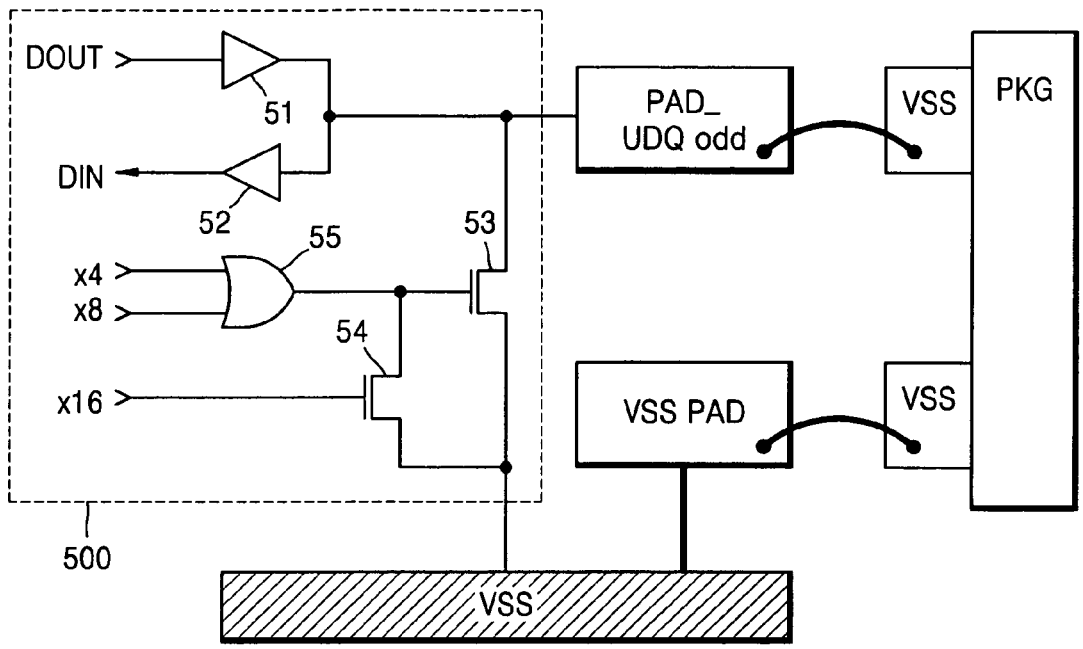
FIG. 5 is a block diagram of a data I/O driver connected to a data I/O pad in turn connected to a ground voltage pin of a package of the semiconductor memory device illustrated in FIG. 4, according to an embodiment of the present invention.

FIG. 5 is a block diagram of a data I/O driver 500 connected to a data I/O pad PAD_UDQ even in turn connected to a ground voltage pin VSS of a package PKG of the semiconductor memory device illustrated in FIG. 4, according to an embodiment of the present invention. Referring to FIG. 5, the data I/O driver 500 includes an output buffer 51, an input buffer 52, a first NMOS transistor 53, a second NMOS transistor 54, and an OR gate 55.

An output terminal of the output buffer 51 and an input terminal of the input buffer 53 are connected to the data I/O pad PAD_UDQ odd. A drain, source, and gate of the first NMOS transistor 53 are connected to the data I/O pad PAD_UDQ odd, a ground voltage VSS, and an output terminal of the OR gate 55, respectively.

The OR gate 55 receives an information signal X4 representing the X4 organization arrangement and an information signal X8 representing the X8 organization arrangement. The data I/O pad PAD_UDQ odd is connected to the ground voltage pin VSS of the package PKG.

A drain and source of the second NMOS transistor 54 are connected to the gate and source of the first NMOS transistor 53, respectively, and an information signal X16 representing the X16 organization arrangement is input to a gate of the second NMOS transistor 54.

When the information signal X4 or the information signal X8 is activated to a logic high level, the first NMOS transistor 53 is turned on. In this case, the data I/O pad PAD_UDQ odd connected to the ground voltage pin VSS of the package PKG, in turn connected to the ground source when the package is bonded to a substrate and in a state of operation, is connected directly to the line of the ground voltage VSS via the first NMOS transistor 53, thereby strengthening and stabilizing the ground voltage level in the semiconductor memory device.

When using the X16 organization, the information signal X16 is activated to a logic high level, the second NMOS transistor 54 is turned on and the first NMOS transistor 53 is used for electrostatic discharge (ESD) protection. In this case, the data I/O pad PAD_UDQ odd is connected to a data I/O pin (not shown) of the package PKG, and not the ground voltage pin VSS.

Figure 6:
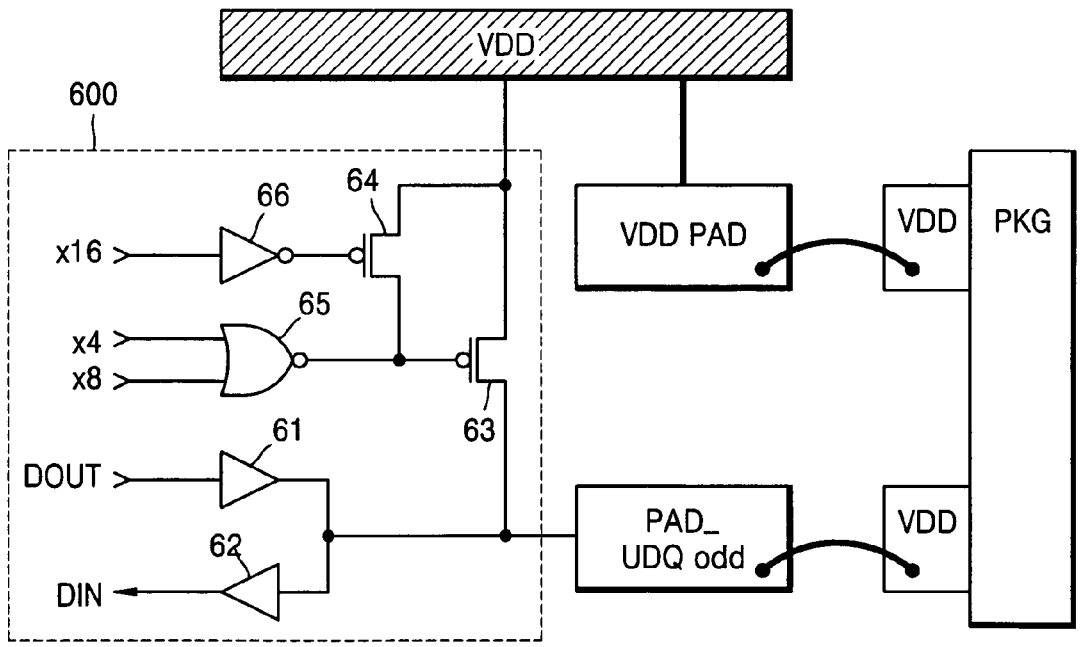
FIG. 6 is a block diagram of a data I/O driver connected to a data I/O pad in turn connected to a power supply voltage pin of a package of the semiconductor memory device illustrated in FIG. 4, according to an embodiment of the present invention.

FIG. 6 is a block diagram of a data I/O driver 600 connected to a data I/O pad PAD_UDQ odd in turn connected to a power supply voltage pin VDD of a package PKG of the semiconductor memory device illustrated in FIG. 4, according to an embodiment of the present invention. The data I/O driver 600 includes an output buffer 61, an input buffer 62, a first PMOS transistor 63, a second PMOS transistor 64, a NOR gate 65, and an inverter 66.

An output terminal of the output buffer 61 and an input terminal of the input buffer 62 are connected to the data I/O pad PAD_UDQ odd. A drain, source, and gate of the first PMOS transistor 63 are connected to the data I/O pad PAD_UDQ odd, a power supply voltage line VDD, and an output terminal of the NOR gate 65, respectively.

The NOR gate 65 receives an information signal X4 representing the X4 organization arrangement and an information signal X8 representing the X8 organization arrangeement. The data I/O pad PAD_UDQ odd is bonded to a power supply voltage pin VDD.

A drain and source of the second PMOS transistor 64 are connected to the gate and source of the first PMOS transistor 63, respectively, and a signal output from the inverter 66 is input to a gate of the second PMOS transistor 64. The inverter 66 receives an information signal X16 representing the X16 organization arrangement.

When the information signal X4 or the information signal X8 is activated to a logic high level, the first PMOS transistor 63 is turned on. In this case, the data I/O pad PAD_UDQ odd connected to the power supply voltage pin VDD of the package PKG, in turn connected to the power supply voltage source when the package is bonded to a substrate and in a state of operation, is connected directly to a power supply voltage line VDD via the first PMOS transistor 63, thereby strengthening and stabilizing the power supply voltage level in the semiconductor memory device.

When the X16 organization is used, the information signal X16 is activated to a logic high level, the second PMOS transistor 64 is turned on and the first PMOS transistor 63 is used for electrostatic discharge (ESD) protection. In this case, the data I/O pad PAD_UDQ odd is connected to a data I/O pin (not shown) of the package PKG, and not the power supply voltage pin VDD.

As described above, it is possible to strengthen and/or stabilize the power level of a semiconductor memory device according to the present invention by utilizing data I/O pads which are in a no connection state. The data I/O pads in a no connection state are bonded to one of the ground voltage VSS and power supply voltage VDD pins of the package, such that when the data I/O pad is not being employed for transporting data, the so called "no connection state" pad is instead used to strengthen and/or stabilize the power level, i.e. ground or power supply level, of the device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device having a plurality of data bit organization arrangements, comprising:
    a plurality of data input/output drivers; and
    a plurality of data input/output pads, each connected to a corresponding one of the plurality of data input/output drivers,
    wherein a first plurality of data input/output pads of the plurality of the data input/output pads are connected to respective data input/output pins of a package, the first plurality of data input/output pads corresponding to a first data bit organization arrangement, and wherein a second plurality of data input/output pads of the plurality of the data input/output pads are not connected to data input/output pins of the package, and are connected to power pins of the package, the second plurality of data input/output pads corresponding to a second data bit organization arrangement having a different data bandwidth than that of the first data bit organization arrangement.

2. The semiconductor memory device of claim 1, wherein each power pin comprises one of a power supply voltage pin and a ground voltage pin.

3. The semiconductor memory device of claim 1, wherein each of the data input/output drivers that is connected to one of the second plurality of data input/output pads which are not connected to the data input/output pins of the package comprises:
    an output buffer, an output terminal of which is connected to a corresponding data input/output pad;
    an input buffer, an input terminal of which is connected to the corresponding data input/output pad;
    a first NMOS transistor, a drain and source of which are connected to the corresponding data input/output pad and a ground voltage line, respectively; and
    a second NMOS transistor, a drain and source of which are connected to a gate and the source of the first NMOS transistor, respectively,
    wherein when an information signal representing a predetermined one of the plurality of data bit organization arrangements is activated, the second NMOS transistor is turned on, and when information signals representing the other organizations are activated, the first NMOS transistor is turned on.

4. The semiconductor memory device of claim 1, wherein each of the data input/output drivers that is connected to one of the second plurality of data input/output pads which are not connected to the data input/output pins of the package comprises:
    an output buffer, an output terminal of which is connected to a corresponding data input/output pad;
    an input buffer, an input terminal of which is connected to the corresponding data input/output pad;
    a first PMOS transistor, a drain and source of which are connected to the corresponding data input/output pad and a power supply voltage line, respectively; and
    a second PMOS transistor, a drain and source of which are connected to a gate and the source of the first PMOS transistor, respectively,
    wherein when an information signal representing a predetermined one of the plurality of data bit organization arrangements is activated, the second PMOS transistor is turned on, and when information signals representing the other organizations are activated, the first PMOS transistor is turned on.

5. The semiconductor memory device of claim 1 wherein the data bit organization arrangements comprise X4, X8, and X16 organizations.

6. A method of strengthening power of a semiconductor memory device at a stabilized power level, the semiconductor memory device having a plurality of data bit organization arrangements, the method comprising:
    connecting a first plurality of data input/output pads of a plurality of data input/output pads to respective data input/output pins of a package, the first plurality of data input/output pads corresponding to a first data bit organization arrangement; and
    connecting a second plurality of data input/output pads of the plurality of data input/output pads that are not connected to the data input/output pins of the package to power pins of the package, the second plurality of data input/output pads corresponding to a second data bit organization arrangement having a different data bandwidth than that of the first data bit organization arrangement.

7. The method of claim 6, wherein each power pin comprises one of a power supply voltage pin and a ground voltage pin.

8. The method of claim 7, further comprising:
providing a first NMOS transistor between a data input/output pad connected to the ground voltage pin and a ground voltage line of the device;
providing a second NMOS transistor between a gate of the first NMOS transistor and the ground voltage line;
activating the second NMOS transistor when an information signal representing a predetermined one of the plurality of organizations is activated; and
activating the first NMOS transistor when information signals representing the other organizations are activated.

9. The method of claim 7, further comprising:
providing a first PMOS transistor between a data input/output pad connected to the power supply voltage pin and a power supply voltage line of the device;
providing a second PMOS transistor between a gate of the first PMOS transistor and the power supply voltage line;
activating the second PMOS transistor when an information signal representing a predetermined one of the plurality of organizations is activated; and
activating the first PMOS transistor when information signals representing the other organizations are activated.

10. The method of claim 6 wherein the data bit organization arrangements comprise X4, X8, and X16 organizations.

11. semiconductor memory device having a plurality of data bit organization arrangements, comprising:
a plurality of data input/output drivers; and
a plurality of data input/output pads, each connected to a corresponding one of the plurality of data input/output drivers,
wherein a first plurality of data input/output pads of the plurality of the data input/output pads are connected to respective data input/output pins of a package, and wherein a second plurality of data input/output pads of the plurality of the data input/output pads are not connected to data input/output pins of the package, and are connected to power pins of the package, wherein each of the data input/output drivers that is connected to one of the second plurality of data input/output pads which are not connected to the data input/output pins of the package comprises:
an output buffer, an output terminal of which is connected to a corresponding data input/output pad;
an input buffer, an input terminal of which is connected to the corresponding data input/output pad;
a first NMOS transistor, a drain and source of which are connected to the corresponding data input/output pad and a ground voltage line, respectively; and
a second NMOS transistor, a drain and source of which are connected to a gate and the source of the first NMOS transistor, respectively,
wherein when an information signal representing a predetermined one of the plurality of data bit organization arrangements is activated, the second NMOS transistor is turned on, and when information signals representing the other organizations are activated, the first NMOS transistor is turned on.

12. A semiconductor memory device having a plurality of data bit organization arrangements, comprising:
a plurality of data input/output drivers; and
a plurality of data input/output pads, each connected to a corresponding one of the plurality of data input/output drivers,
wherein a first plurality of data input/output pads of the plurality of the data input/output pads are connected to respective data input/output pins of a package, and wherein a second plurality of data input/output pads of the plurality of the data input/output pads are not connected to data input/output pins of the package, and are connected to power pins of the package, wherein each of the data input/output drivers that is connected to one of the second plurality of data input/output pads which are not connected to the data input/output pins of the package comprises:
an output buffer, an output terminal of which is connected to a corresponding data input/output pad;
an input buffer, an input terminal of which is connected to the corresponding data input/output pad;
a first PMOS transistor, a drain and source of which are connected to the corresponding data input/output pad and a power supply voltage line, respectively; and
a second PMOS transistor, a drain and source of which are connected to a gate and the source of the first PMOS transistor, respectively,
wherein when an information signal representing a predetermined one of the plurality of data bit organization arrangements is activated, the second PMOS transistor is turned on, and when information signals representing the other organizations are activated, the first PMOS transistor is turned on.

13. A method of strengthening power of a semiconductor memory device at a stabilized power level, the semiconductor memory device having a plurality of data bit organization arrangements, the method comprising:
connecting a first plurality of data input/output pads of a plurality of data input/output pads to respective data input/output pins of a package; and
connecting a second plurality of data input/output pads of the plurality of the data input/output pads that are not connected to the data input/output pins of the package to power pins of the package, wherein each power pin comprises one of a power supply voltage pin and a ground voltage pin;
providing a first NMOS transistor between a data input/output pad connected to the ground voltage pin and a ground voltage line of the device;
providing a second NMOS transistor between a gate of the first NMOS transistor and the ground voltage line;
activating the second NMOS transistor when an information signal representing a predetermined one of the plurality of organizations is activated; and
activating the first NMOS transistor when information signals representing the other organizations are activated.

14. A method of strengthening power of a semiconductor memory device at a stabilized power level, the semiconductor memory device having a plurality of data bit organization arrangements, the method comprising:
connecting a first plurality of data input/output pads of a plurality of data input/output pads to respective data input/output pins of a package; and
connecting a second plurality of data input/output pads of the plurality of the data input/output pads that are not connected to the data input/output pins of the package to power pins of the package, wherein each power pin comprises one of a power supply voltage pin and a ground voltage pin;

providing a first PMOS transistor between a data input/output pad connected to the power supply voltage pin and a power supply voltage line of the device;

providing a second PMOS transistor between a gate of the first PMOS transistor and the power supply voltage line;

activating the second PMOS transistor when an information signal representing a predetermined one of the plurality of organizations is activated; and activating the first PMOS transistor when information signals representing the other organizations are activated.

* * * * *